United States Patent
Brown et al.

(10) Patent No.: US 6,870,439 B2
(45) Date of Patent: *Mar. 22, 2005

(54) TUNABLE TRANSMISSION LINE STUB COUPLED TO A FLUID DIELECTRIC

(75) Inventors: Stephen B. Brown, Palm Bay, FL (US); James J. Rawnick, Palm Bay, FL (US)

(73) Assignee: Harris Corporation, Melbourne, FL (US)

( * ) Notice: Subject to any disclaimer, the term of this patent is extended or adjusted under 35 U.S.C. 154(b) by 33 days.

This patent is subject to a terminal disclaimer.

(21) Appl. No.: 10/387,194

(22) Filed: Mar. 11, 2003

(65) Prior Publication Data

US 2004/0178869 A1 Sep. 16, 2004

(51) Int. Cl.$^7$ ................................................ H03H 7/38
(52) U.S. Cl. ........................................ 333/33; 333/263
(58) Field of Search ........................... 333/263, 33, 35, 333/246

(56) References Cited

U.S. PATENT DOCUMENTS

| | | | | |
|---|---|---|---|---|
| 4,906,956 | A | * 3/1990 | Kakihana | 333/246 |
| 5,162,972 | A | 11/1992 | Gripshover et al. | |
| 5,877,123 | A | * 3/1999 | Das | 505/210 |
| 6,496,082 | B1 | * 12/2002 | DiPiazza | 333/101 |
| 6,515,235 | B2 | 2/2003 | Moller | |

OTHER PUBLICATIONS

U.S. Appl. No. 10/369,436, filed Feb. 18, 2003, Rawnick et al.
U.S. Appl. No. 10/387,208, filed Mar. 11, 2003, Rawnick et al.
U.S. Appl. No. 10/330,755, filed Dec. 27, 2002, Rawnick et al.
U.S. Appl. No. 10/330,754, filed Dec. 27, 2002, Rawnick et al.
U.S. Appl. No. 10/300,456, filed Nov. 19, 2002, Rawnick et al.
U.S. Appl. No. 10/361,548, filed Feb. 10, 2003, Rawnick et al.
U.S. Appl. No. 10/387,209, filed Mar. 11, 2003, Rawnick et al.
U.S. Appl. No. 10/438,435, filed May 15, 2003, Brown et al.
U.S. Appl. No. 10/414,696, filed Apr. 16, 2003, Brown et al.
U.S. Appl. No. 10/637,027, filed Aug. 7, 2003, Brown et al.
U.S. Appl. No. 10/414,650, filed Apr. 16, 2003, Brown et al.
U.S. Appl. No. 10/635,629, filed Aug. 6, 2003, Brown et al.
U.S. Appl. No. 10/459,067, filed Jun. 11, 2003, Brown et al.
U.S. Appl. No. 10/438,436, filed May 15, 2003, Rawnick et al.

(List continued on next page.)

*Primary Examiner*—Stephen E. Jones
(74) *Attorney, Agent, or Firm*—Sacco & Associates, PA

(57) ABSTRACT

A circuit for processing radio frequency signals. The circuit is a transmission line stub (110) coupled to a fluidic dielectric (108) and includes a composition processor (101) for selectively varying a composition of the fluidic dielectric. Varying the fluid dielectric composition allows the electrical characteristics of the transmission line stub (110) to be dynamically varied in response to a control signal 137. The electrical characteristics that can be varied with the fluid dielectric include, but are not limited to, an electrical length of the stub, a characteristic impedance of the stub, and a frequency response of the stub. The transmission line stub (110) can be electrically shorted to ground or electrically open with respect to ground.

35 Claims, 3 Drawing Sheets

OTHER PUBLICATIONS

U.S. Appl. No. 10/626,090, filed Jul. 24, 2003, Brown et al.
U.S. Appl. No. 10/635,582, filed Aug. 6, 2003, Rawnick et al.
U.S. Appl. No. 10/632,632, filed Aug. 1, 2003, Rawnick et al.
U.S. Appl. No. 10/614,149, filed Jul. 7, 2003, Brown et al.
U.S. Appl. No. 10/634,219, filed Aug. 5, 2003, Rawnick et al.
U.S. Appl. No. 10/458,859, filed Jun. 11, 2003, Rawnick et al.
U.S. Appl. No. 10/624,378, filed Jul. 22, 2003, Brown et al.
U.S. Appl. No. 10/438,433, filed May 15, 2003, Rawnick et al.
U.S. Appl. No. 10/460,947, filed Jun. 13, 2003, Rawnick et al.
U.S. Appl. No. 10/421,352, filed Apr. 23, 2003, Rawnick et al.
U.S. Appl. No. 10/409,261, filed Apr. 8, 2003, Pike.
U.S. Appl. No. 10/441,743, filed May 19, 2003, Pike.
U.S. Appl. No. 10/628,846, filed Jul. 28, 2003, Pike et al.
U.S. Appl. No. 10/300,455, filed Nov. 19, 2002, Brown et al.

* cited by examiner

TUNABLE TRANSMISSION LINE STUB COUPLED TO A FLUID DIELECTRIC

BACKGROUND OF THE INVENTION

1. Statement of the Technical Field

The inventive arrangements relate generally to transmission line stubs, and more particularly for transmission line stubs that can be dynamically tuned.

2. Description of the Related Art

Transmission line stubs are commonly used in radio frequency (RF) circuits. For example, a resonant transmission line stub is sometimes said to be resonant at a particular frequency, meaning the line has impedance characteristics similar to a resonant circuit at that frequency, although resonant line characteristics are actually a function of voltage reflections, not circuit resonance. On printed circuit boards or substrates, resonant lines are typically implemented by creating a line with at least one port at the input and either an open-circuit or short-circuit to ground at the termination. The input impedance to an open or shorted resonant line is typically resistive when the length of the resonant line is an even or odd multiple of a quarter-wavelength of the operational frequency. That is, the input to the resonant line is at a position of voltage maxima or minima. When the input to the resonant line is at a position between the voltage maxima and minima points, the input impedance can have reactive components. Consequently, properly chosen transmission line stubs may be used as parallel-resonant, series-resonant, inductive, or capacitive circuits.

Transmission lines stubs in RF circuits are typically formed in one of three ways. One configuration known as microstrip, places the signal line on the top of a board surface. A second conductive layer, commonly referred to as a ground plane, is spaced apart from and below the signal line. A second type of configuration known as buried microstrip is similar except that the signal line is covered with a dielectric substrate material. In a third configuration known as stripline, the signal line is sandwiched between two electrically conductive (ground) planes. Other configurations, including waveguide stubs, are also known in the art.

Low permittivity printed circuit board materials are ordinarily selected for implementing RF circuit designs, including transmission line stubs. For example, polytetrafluoroethylene (PTFE) based composites such as RT/duroid® 6002 (permittivity of 2.94; loss tangent of 0.009) and RT/duroid® 5880 (permittivity of 2.2; loss tangent of 0.0007), both available from Rogers Microwave Products, Advanced Circuit Materials Division, 100 S. Roosevelt Ave, Chandler, Ariz. 85226, are common board material choices.

Two important characteristics of dielectric materials are permittivity (sometimes called the relative permittivity or $\in_r$) and permeability (sometimes referred to as relative permeability or $\mu_r$). The relative permittivity and permeability determine the propagation velocity of a signal, which is approximately inversely proportional to $\sqrt{\mu\in}$. The propagation velocity directly affects the electrical length of a transmission line and therefore the physical length of a transmission line stub.

Further, ignoring loss, the characteristic impedance of a transmission line, such as stripline or microstrip, is equal to $\sqrt{L_l/C_l}$ where $L_l$ is the inductance per unit length and $C_l$ is the capacitance per unit length. The values of $L_l$ and $C_l$ are generally determined by the permittivity and the permeability of the dielectric material(s) used to separate the transmission line structures as well as the physical geometry and spacing of the line structures. Accordingly, the overall geometry of a stub will be highly dependent on the permittivity and permeability of the dielectric substrate.

The electrical characteristics of transmission line stubs generally cannot be modified once formed on an RF circuit board. This is not a problem where only a fixed frequency response is needed. The geometry of the transmission line can be readily designed and fabricated to achieve the proper characteristic impedance. When a variable frequency response is needed, however, use of a fixed length stub can be a problem.

A similar problem is encountered in RF circuit design with regard to optimization of circuit components for operation on different RF frequency bands. Line impedances and lengths that are optimized for a first RF frequency band may provide inferior performance when used for other bands, either due to impedance variations and/or variations in electrical length. Such limitations can limit the effective operational frequency range for a given RF system.

SUMMARY OF THE INVENTION

The present invention relates to a circuit for processing radio frequency signals. The circuit is a transmission line stub coupled to a fluidic dielectric and includes a composition processor for selectively varying a composition of the fluidic dielectric. Varying the fluid dielectric composition allows the electrical characteristics of the transmission line stub to be dynamically varied in response to a control signal.

The composition processor can selectively vary a permittivity and a permeability of the fluidic dielectric. Further, according to one aspect of the invention, the composition processor can vary the permittivity and the permeability concurrently in response to the control signal.

The electrical characteristics that can be varied with the fluid dielectric include, but are not limited to, an electrical length of the stub, a characteristic impedance of the stub, and a frequency response of the stub. The transmission line stub itself can be electrically shorted to ground or electrically open with respect to ground.

According to another aspect of the the transmission line stub is also coupled to a solid dielectric. For example, the solid dielectric can be a circuit board upon which the stub is formed. A cavity can be disposed within the dielectric circuit board substrate, and the fluidic dielectric can be disposed within the cavity.

According to one aspect, the invention can also include a component mixer. The component mixer can be arranged for dynamcially mixing a plurality of component parts of the fluidic dielectric responsive to the control signal to form the fluidic dielectric. The component parts can be selected from a low permittivity, low permeability component, a high permittivity, low permeability component, and a high permittivity, high permeability component. The composition processor further can include one or more proportional valves, one or more mixing pumps, and at least one conduit. The composition processor selectively mixes the plurality of component parts of the fluidic dielectric and transfers the fluidic dielectric to a cavity where the fluidic dielectric is coupled to the transmission line stub. According to another aspect of the invention, the composition processor can also include a component part separator adapted for separating the component parts of the fluidic dielectric for subsequent reuse.

According to one aspect, the fluidic dielectric can be comprised of an industrial solvent that has a suspension of magnetic particles contained therein. The magnetic particles can be formed of a material selected from the group consisting of ferrite, metallic salts, and organo-metallic particles. For example, the fluidic dielectric can be between about 50% to 90% magnetic particles by weight.

The invention can also include a method for dynamically controlling a frequency response of a transmission line stub. The method can include the steps of coupling the transmission line stub to a fluidic dielectric and, in response to a control signal, selectively varying a composition of the fluidic dielectric. The method permits dynamic changes to be performed relative to an electrical characteristic of the transmission line stub. The composition of the fluidic dielectric can be varied so as to modify a permittivity and a permeability of the fluidic dielectric. According to one aspect of the invention, this step can include varying the permittivity and the permeability concurrently in response to the control signal. The result is a corresponding variation in an electrical length, a characteristic impedance, and a frequency response, of the transmission line stub.

The method can also include the step of electrically shorting one end of the transmission line stub to a ground potential or forming an open circuit at one end of the transmission line stub. According to another aspect, the method can include the step of also coupling the transmission line stub to a solid dielectric. For example, this can include selecting the solid dielectric to be a circuit board upon which the stub is formed. In that case, the method can also advantageously include step of disposing the fluid dielectric in a cavity within the dielectric circuit board substrate.

According to yet another aspect, the method can include selecting a component part of the fluid dielectric from the group consisting of a low permittivity, low permeability component, a high permittivity, low permeability component, and a high permittivity, high permeability component. These components can be selectively mixed and communicated from respective fluid reservoirs to a cavity where the fluidic dielectric is coupled to the transmission line stub. Notably, the method can also include the step of separating the component parts of the fluidic dielectric for subsequent reuse.

Finally, the method can also include the step of selecting the fluidic dielectric to be an industrial solvent, either with or without a suspension of magnetic particles contained therein. If magnetic particles are used, the invention can further include the step of selecting the magnetic particles from the group consisting of ferrite, metallic salts, and organo-metallic particles. This step can include selecting a ratio of the component parts so that the fluid dielectric contains between about 50% to 90% magnetic particles by weight.

DETAILED DESCRIPTION OF THE PREFERRED EMBODIMENTS

Figure 1:
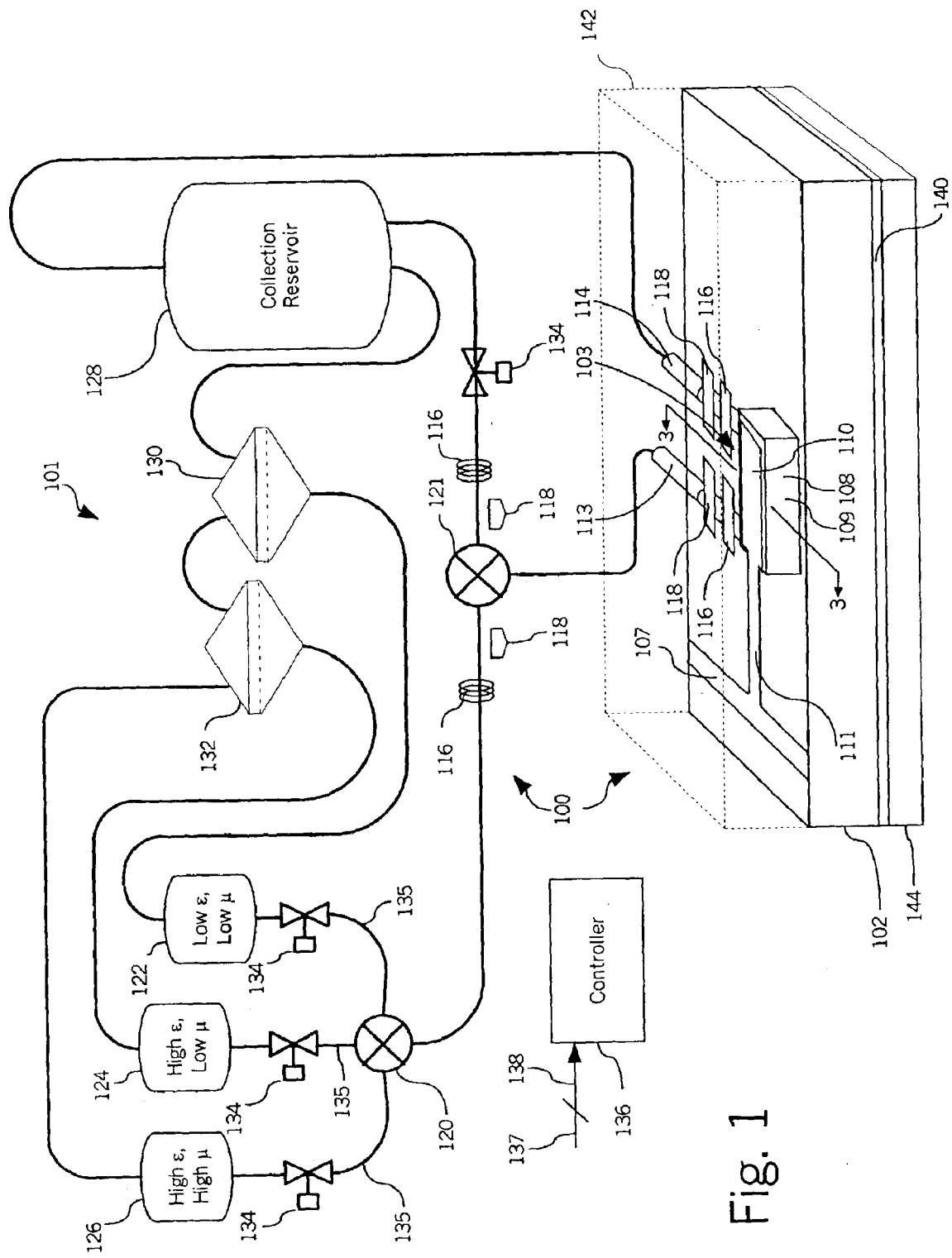
FIG. 1 is a block diagram useful for understanding the transmission line stub of the invention.

FIG. 1 is a conceptual diagram that is useful for understanding the tunable transmission line stub system of the present invention. The tunable transmission line stub system 100 includes a conductive RF transmission line stub 110 at least partially coupled to a fluidic dielectric 108. In most instances, the stub 110 will be coupled to a larger circuit by associated transmission line circuitry. In FIG. 1, such circuitry is illustrated by a first transmission line 107 and a second transmission line 111. Those skilled in the art will appreciate that these transmission lines are merely shown by way of example and are not intended to limit the scope of the invention. Instead, any suitable input and output circuitry can be provided for communicating signals to and from the stub 110.

The fluidic dielectric 108 is preferably constrained within a cavity region 109 that is generally positioned relative to the RF transmission line stub 110 so as to be electrically and magnetically coupled thereto. It should be understood that while the RF transmission line stub 110 is shown in FIG. 1 as a conductor suspended within a dielectric layers 102, 142 over a ground plane 140, the invention is not so limited. Other transmission line structures can also be used to form the stub and such structures are within the scope of the invention provided that the stub is coupled to a fluid dielectric as described herein.

A composition processor 101 is preferably provided for changing a composition of the fluidic dielectric 108 to vary its permittivity. A controller 136 controls the composition processor for selectively varying the permittivity of the fluidic dielectric 108 in response to a control signal 137 received on control line 138. The composition processor 101 is also adapted for changing a composition of the fluidic dielectric 108 to vary its permeability. According to a preferred embodiment, the controller 136 can cause the composition processor 101 to selectively vary the permittivity and the permeability of the fluidic dielectric concurrently in response to the control signal. Thus, the controller can vary the frequency response of the stub in accordance with an input control signal 137 by effectively vary the inductance and capacitance per unit length of the stub. According to a preferred embodiment, the composition processor also includes separator units 130, 132 for separating out component parts of the fluidic dielectric so that they can be subsequently refused. The composition of the fluidic dielectric, the dynamic mixing process, and the component part separation process shall now be discussed in further detail.

Composition of Fluidic Dielectric

The fluidic dielectric can be comprised of several component parts that can be mixed together to produce a desired permeability and permittivity required for a particular stub electrical response. In this regard, it will be readily appreciated that fluid miscibility and particle suspension are key considerations to ensure proper mixing. Another key consideration is the relative ease by which the component parts can be subsequently separated from one another. The ability to separate the component parts is important when the stub frequency response requirements change. Specifically, this feature ensures that the component parts can be subsequently re-mixed in a different proportion to form a new fluidic dielectric.

The resultant mixture comprising the fluidic dielectric also preferably has a relatively low loss tangent to minimize the amount of RF energy lost in the stub 110. However, devices with higher insertion loss may be acceptable in some instances so this may not be a critical factor. Also, the components of the fluidic dielectric must be capable of providing the proper permittivity and permeability. Aside from the foregoing constraints, there are relatively few limits on the range of component parts that can be used to form the fluidic dielectric. Accordingly, those skilled in the art will recognize that the examples of component parts, mixing methods and separation methods as shall be disclosed herein are merely by way of example and are not intended to limit in any way the scope of the invention.

Also, the component materials are described herein as being mixed in order to produce the fluidic dielectric. However, it should be noted that the invention is not so limited. Instead, it should be recognized that the composition of the fluidic dielectric could be modified in other ways. For example, the component parts could be selected to chemically react with one another in such a way as to produce the fluidic dielectric with the desired values of permittivity and or permeability. All such techniques will be understood to be included to the extent that it is stated that the composition of the fluidic dielectric is changed.

A nominal value of permittivity ($\in_r$) for fluids is approximately 2.0. However, the component parts for the fluidic dielectric can include fluids with extreme values of permittivity. Consequently, a mixture of such component parts can be used to produce a wide range of intermediate permittivity values. For example, component fluids could be selected with permittivity values of approximately 2.0 and about 58 to produce a fluidic dielectric with a permittivity anywhere within that range after mixing. Dielectric particle suspensions can also be used to increase permittivity.

According to a preferred embodiment, the component parts of the fluidic dielectric can be selected to include a low permittivity, low permeability component and a high permittivity, high permeability component. These two components can be mixed as needed for increasing permittivity while maintaining a relatively constant ratio of permittivity to permeability. A third component part of the fluidic dielectric can include a high permittivity, low permeability component for allowing adjustment of the permittivity of the fluidic dielectric independent of the permeability.

High levels of magnetic permeability are commonly observed in magnetic metals such as Fe and Co. For example, solid alloys of these materials can exhibit levels of $\mu_r$ in excess of one thousand. By comparison, the permeability of fluids is nominally about 1.0 and they generally do not exhibit high levels of permeability. However, high permeability can be achieved in a fluid by introducing metal particles/elements to the fluid. For example typical magnetic fluids comprise suspensions of ferro-magnetic particles in a conventional industrial solvent such as water, toluene, mineral oil, silicone, and so on. Other types of magnetic particles include metallic salts, organo-metallic compounds, and other derivatives, although Fe and Co particles are most common. The size of the magnetic particles found in such systems is known to vary to some extent. However, particles sizes in the range of 1 nm to 20 $\mu$m are common. The composition of particles can be varied as necessary to achieve the required range of permeability in the final mixed fluidic dielectric after mixing. However, magnetic fluid compositions are typically between about 50% to 90% particles by weight. Increasing the number of particles will generally increase the permeability.

An example of a set of component parts that could be used to produce a fluidic dielectric as described herein would include oil (low permittivity, low permeability), a solvent (high permittivity, low permeability) and a magnetic fluid, such as combination of an oil and a ferrite (low permittivity and high permeability). A hydrocarbon dielectric oil such as Vacuum Pump Oil MSDS-12602 could be used to realize a low permittivity, low permeability fluid, low electrical loss fluid. A low permittivity, high permeability fluid may be realized by mixing same hydrocarbon fluid with magnetic particles such as magnetite manufactured by FerroTec Corporation of Nashua, N.H., or iron-nickel metal powders manufactured by Lord Corporation of Cary, N.C. for use in ferrofluids and magnetoresrictive (MR) fluids. Additional ingredients such as surfactants may be included to promote uniform dispersion of the particle. Fluids containing electrically conductive magnetic particles require a mix ratio low enough to ensure that no electrical path can be created in the mixture.

Solvents such as formamide inherently posses a relatively high permittivity and therefore can be used as the high permittivity component for the invention. Permittivity of other types of fluid can also be increased by adding high permittivity powders such as barium titanate manufactured by Ferro Corporation of Cleveland, Ohio. For broadband applications, the fluids would not have significant resonances over the frequency band of interest.

Processing of Fluidic Dielectric for Mixing/Unmixing of Components

Referring again to FIG. 1, the composition processor 101 can be comprised of a plurality of fluid reservoirs containing component parts of fluidic dielectric 108. These can include a first fluid reservoir 122 for a low permittivity, low permeability component of the fluidic dielectric, a second fluid reservoir 124 for a high permittivity, low permeability component of the fluidic dielectric, and a third fluid reservoir 126 for a high permittivity, high permeability component of the fluidic dielectric. Those skilled in the art will appreciate that other combinations of component parts may also be suitable and the invention is not intended to be limited to the specific combination of component parts described herein.

Figure 2:
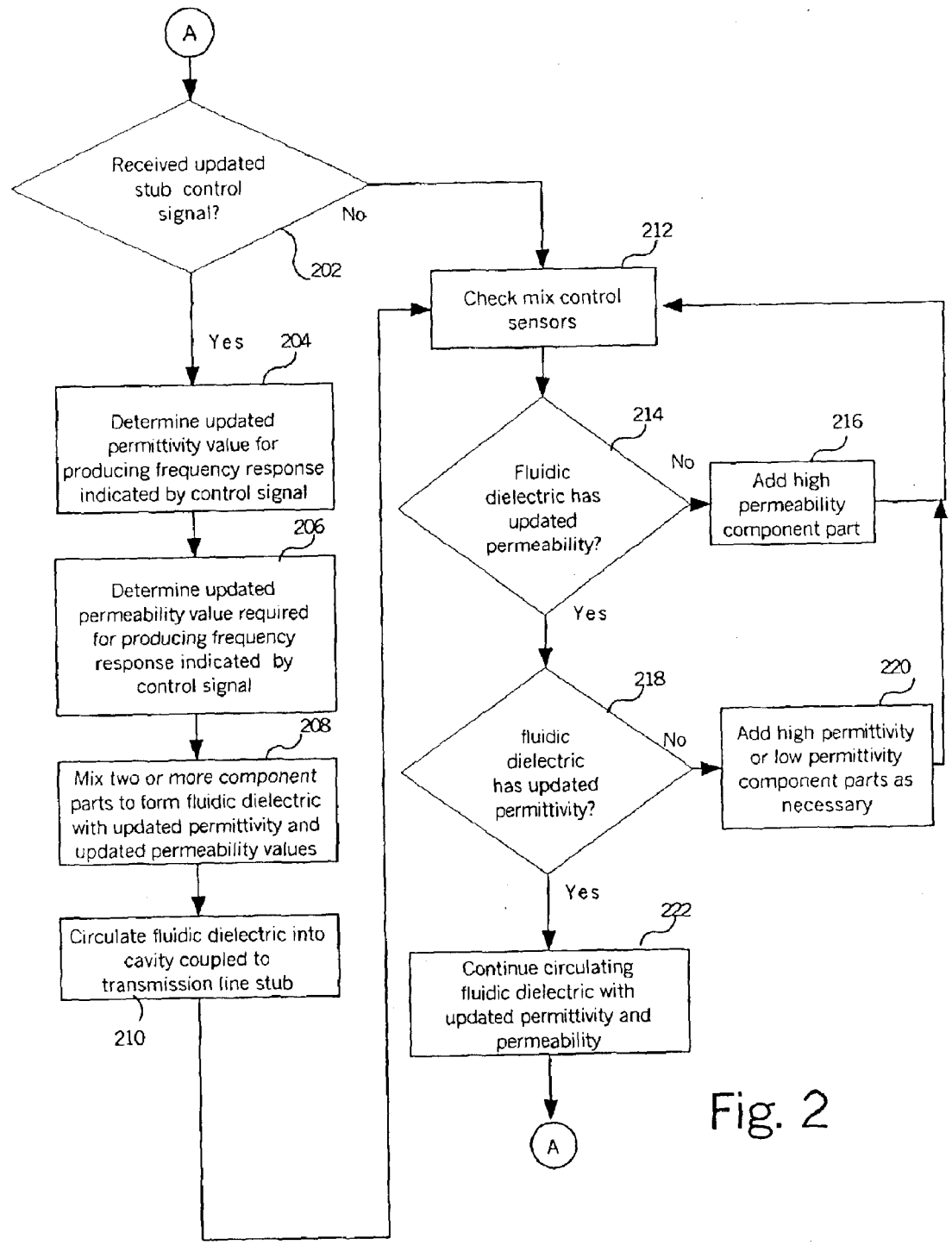
FIG. 2 is a flow chart that is useful for understanding the process of the invention.

A cooperating set of proportional valves 134, mixing pumps 120, 121, and connecting conduits 135 can be provided as shown in FIG. 1 for selectively mixing and communicating the components of the fluidic dielectric 108 from the fluid reservoirs 122, 124, 126 to cavity 109. The composition processor also serves to separate out the component parts of fluidic dielectric 108 so that they can be subsequently re-used to form the fluidic dielectric with different permittivity and/or permeability values. All of the various operating functions of the composition processor can be controlled by controller 136. The operation of the composition processor shall now be described in greater detail with reference to FIG. 1 and the flowchart shown in FIG. 2.

The process can begin in step 202 of FIG. 1, with controller 136 checking to see if an updated control signal 137 has been received on a control signal input line 138. If so, then the controller 136 continues on to step 204 to determine an updated permittivity value for producing the stub frequency response indicated by the control signal. The updated permittivity value necessary for achieving the indicated stub frequency response can be determined using a look-up table. Alternatively, the updated permittivity value can be calculated directly using equations well known to those skilled in the art for calculating capacitance per unit length. In step 206, the controller can determine an updated permeability value required for achieving the desired inductance per unit length for achieving the indicated frequency response for transmission line stub 110.

In step 208, the controller 136 causes the composition processor 101 to begin mixing two or more component parts in a proportion to form fluidic dielectric that has the updated permittivity and permeability values determined earlier. This mixing process can be accomplished by any suitable means. For example, in FIG. 1 a set of proportional valves 134, conduits 135, and mixing pump 120 are used to mix component parts from reservoirs 122, 124, 126 appropriate to achieve the desired updated permeability and permittivity.

In step 210, the controller causes the newly mixed fluidic dielectric 108 to be circulated into the cavity 109 through a second mixing pump 121. In step 212, the controller checks one or more sensors 116, 118 to determine if the fluidic dielectric being circulated through the cavity 109 has the proper values of permeability and permittivity. Sensors 116 are preferably inductive type sensors capable of measuring permeability. Sensors 118 are preferably capacitive type sensors capable of measuring permittivity. The sensors can be located as shown, at the input to mixing pump 121. Sensors 116, 118 can also be positioned within solid dielectric substrate 102 to measure the permeability and permittivity of the fluidic dielectric passing through input conduit 113 and output conduit 114. Note that it is desirable to have a second set of sensors 116, 118 at or near the cavity 109 so that the controller can determine when the fluidic dielectric with updated permittivity and permeability values has completely replaced any previously used fluidic dielectric that may have been present in the cavity 109.

In step 214, the controller 136 compares the measured permeability to the desired updated permeability value determined in step 206. If the fluidic dielectric does not have the proper updated permeability value, the controller 136 can cause additional amounts of high permeability component part to be added to the mix from reservoir 126 and continues circulating the modified fluidic dielectric 108 to the cavity 109.

If the fluidic dielectric 108 is determined to have the proper level of permeability in step 214, then the process continues on to step 218 where the measured permittivity value from step 212 is compared to the desired updated permittivity value from step 204. If the updated permittivity value has not been achieved, then high or low permittivity component parts are added as necessary in step 210 and the modified fluid is circulated to the cavity 109. If both the permittivity and permeability passing into and out of the cavity 109 are the proper value, the system can stop circulating the fluidic dielectric and the system returns to step 202 to wait for the next updated control signal.

Significantly, when updated fluidic dielectric is required, any existing fluidic dielectric can be circulated out of the cavity 109. Any existing fluidic dielectric not having the proper permeability and/or permittivity can be deposited in a collection reservoir 128. The fluidic dielectric deposited in the collection reservoir can thereafter be re-used directly as a fourth fluid by mixing with the first, second, and third fluids or separated out into its component parts in separator units 130, 132 so that it may be re-used at a later time to produce additional fluidic dielectric. The aforementioned approach includes a method for sensing the properties of the collected fluid mixture to allow the fluid processor to appropriately mix the desired composition, and thereby, allowing a reduced volume of separation processing to be required.

According to a preferred embodiment, the component parts of the fluidic dielectric 108 can be selected to include a first fluid made of a high permittivity solvent completely miscible with a second fluid made of a low permittivity oil that has a significantly different boiling point. A third fluid component can be comprised a ferrite particle suspension in a low permittivity oil identical to the first fluid such that the first and second fluids do not form azeotropes. Given the foregoing, the following process may be used to separate the component parts.

A first stage separation process in separator unit 130 would utilize distillation to selectively remove the first fluid from the mixture by the controlled application of heat thereby evaporating the first fluid, transporting the gas phase to a physically separate condensing surface whose temperature is maintained below the boiling point of the first fluid, and collecting the liquid condensate for transfer to the first fluid reservoir 122. A second stage process in separator unit 132 would introduce the mixture, free of the first fluid, into a chamber that includes an electromagnet that can be selectively energized to attract and hold the paramagnetic particles while allowing the pure second fluid to pass which is then diverted to the second fluid reservoir 124. Upon de-energizing the electromagnet, the third fluid would be recovered by allowing the previously trapped magnetic particles to combine with the fluid exiting the first stage which is then diverted to the third fluid reservoir 126.

Those skilled in the art will recognize that the specific process used to separate the component parts from one another will depend largely upon the properties of materials that are selected and the invention. Accordingly, the invention is not intended to be limited to the particular process outlined above.

RF Unit Structure, Materials and Fabrication

Figure 3A:
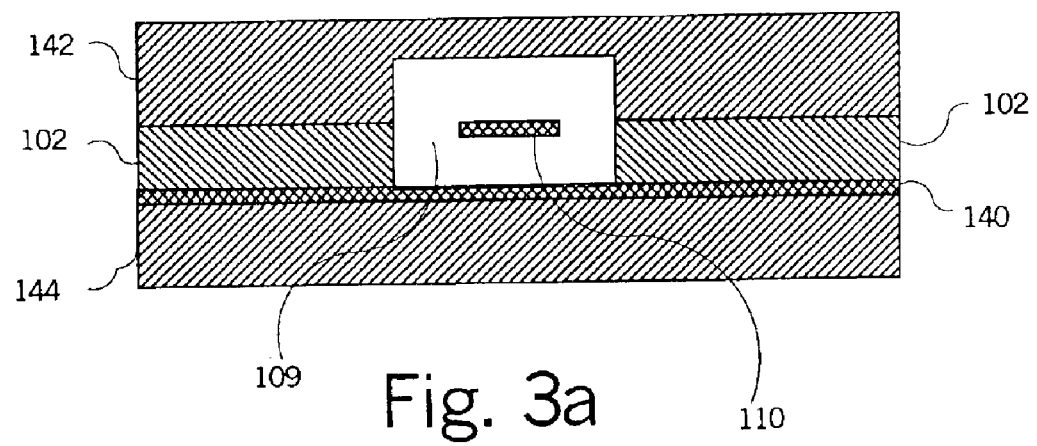
FIG. 3a is a cross-sectional view of the transmission line structure in FIG. 1, taken along line 3—3

FIG. 3a is a cross-sectional view of one embodiment of the transmission line structure in FIG. 1, taken along line 3—3, that is useful for understanding the invention. As illustrated therein, cavity 109 can be formed in solid dielectric layer 102 and continued in solid dielectric layer 142 so that the fluidic dielectric is closely coupled to transmission line stub 110 on all sides of conductor. The transmission line stub 110 is suspended within the cavity 109 as shown. A ground plane 140 is disposed below the conductor forming the transmission line stub 110. The ground plane is located between solid dielectric layer 102 and base substrate 144.

Figure 3B:
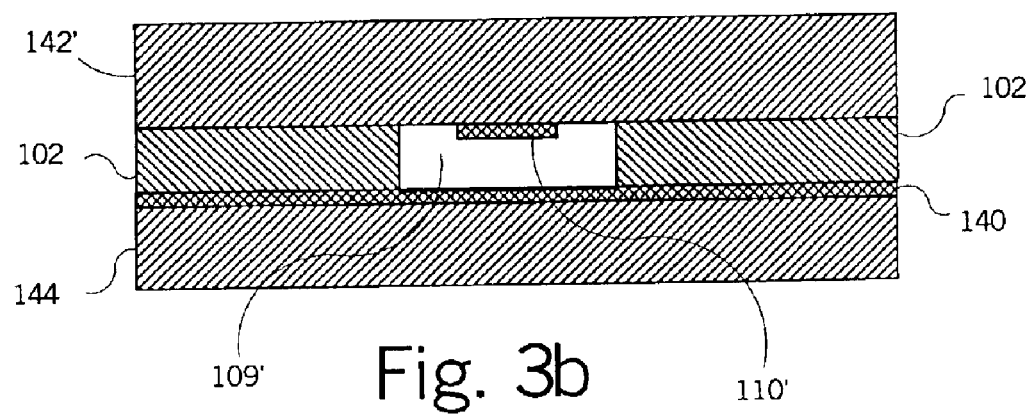
FIG. 3b is a cross-sectional view of an alternative embodiment of a transmission line structure of FIG. 1 taken along line 3—3.

FIG. 3b is a cross-sectional view showing an alternative transmission line stub 110' for a delay line in which the cavity structure 109' extends on only one side of the conductor 111' and the conductor 111' is partially coupled to the solid dielectric layer 142'.

At this point it should be noted that while the embodiment of the invention in FIG. 1 is shown essentially in the form of a buried microstrip construction, the invention herein is not intended to be so limited. Instead, the invention can be implemented using any type of transmission line by replacing at least a portion of a conventional solid dielectric material that is normally coupled to the transmission line with a fluidic dielectric as described herein. For example, and without limitation, the invention can be implemented in transmission line configurations including conventional waveguides, stripline, microstrip, coaxial lines, and embedded coplanar waveguides. All such structures are intended to be within the scope of the invention.

According to one aspect of the invention, the solid dielectric layers 102, 142, 144 can be formed from a ceramic material. For example, the solid dielectric substrate can be formed from a low temperature co-fired ceramic (LTCC). Processing and fabrication of RF circuits on LTCC is well known to those skilled in the art. LTCC is particularly well suited for the present application because of its compatibility and resistance to attack from a wide range of fluids. The material also has superior properties of wetability and absorption as compared to other types of solid dielectric material. These factors, plus LTCC's proven suitability for manufacturing miniaturized RF circuits, make it a natural choice for use in the present invention.

While the preferred embodiments of the invention have been illustrated and described, it will be clear that the invention is not so limited. Numerous modifications, changes, variations, substitutions and equivalents will occur to those skilled in the art without departing from the spirit and scope of the present invention as described in the claims.

What is claimed is:

1. A circuit for processing radio frequency signals, comprising:
   a transmission line stub coupled to a fluidic dielectric; and
   a composition processor for selectively varying a composition of the fluidic dielectric so as to dynamically change an electrical characteristic of said transmission line stub in response to a control signal.

2. The circuit of claim 1 wherein said composition processor selectively varies at least one of a permittivity and a permeability of said fluidic dielectric.

3. The circuit of claim 2 wherein said composition processor selectively varies said permittivity and said permeability concurrently in response to said control signal.

4. The circuit of claim 1 wherein said electrical characteristic is at least one of an electrical length of said stub, a characteristic impedance of said stub, and a frequency response of said stub.

5. The circuit of claim 1 wherein an end of said transmission line stub is electrically shorted to said ground.

6. The circuit of claim 1 wherein an end of said transmission line stub is electrically open with respect to ground.

7. The circuit of claim 1 wherein said transmission line stub is also coupled to a solid dielectric.

8. The circuit of claim 7 wherein said solid dielectric is a circuit board upon which said stub is formed.

9. The circuit of claim 1 further comprising a dielectric circuit board substrate upon which said transmission line stub is disposed.

10. The circuit of claim 9 further comprising a cavity disposed within said dielectric circuit board substrate, and wherein said fluidic dielectric is disposed within said cavity.

11. The circuit of claim 1 further comprising a component mixer arranged for dynamcially mixing a plurality of component parts of said fluidic dielectric responsive to said control signal to form said fluidic dielectric.

12. The circuit of claim 11 wherein said component parts are selected from the group consisting of a low permittivity, low permeability component, a high permittivity, low permeability component, and a high permittivity, high permeability component.

13. The circuit according to claim 12 wherein said composition processor further comprises at least one proportional valve, at least one mixing pump, and at least one conduit for selectively mixing said plurality of component parts of said fluidic dielectric and transferring said fluidic dielectric to a cavity where said fluidic dielectric is coupled to said transmission line stub.

14. The circuit of claim 13 wherein said composition processor further comprises a component part separator adapted for separating said component parts of said fluidic dielectric for subsequent reuse.

15. The circuit of claim 1 wherein said fluidic dielectric is comprised of an industrial solvent.

16. The circuit of claim 1 wherein at least one component of said fluidic dielectric is comprised of an industrial solvent that has a suspension of magnetic particles contained therein.

17. The circuit of claim 16 wherein said magnetic particles are formed of a material selected from the group consisting of ferrite, metallic salts, and organo-metallic particles.

18. The circuit of claim 16 wherein said component contains between about 50% to 90% magnetic particles by weight.

19. A method for dynamically controlling a frequency response of a transmission line stub, comprising the steps of:
   coupling said transmission line stub to a fluidic dielectric; and
   responsive to a control signal, selectively varying a composition of said fluidic dielectric to dynamically change an electrical characteristic of said transmission line stub.

20. The method of claim 19 further comprising the step of selectively varying at least one of a permittivity and a permeability of said fluidic dielectric.

21. The method of claim 20 further comprising the step of selectively varying said permittivity and said permeability concurrently in response to said control signal.

22. The method of claim 19 further comprising the step of varying said composition so as to modify at least one of an electrical length, a characteristic impedance, and a frequency response, of said transmission line stub.

23. The method of claim 19 further comprising the step of electrically shorting one end of said transmission line stub to a ground potential.

24. The method of claim 19 further comprising the step of forming an open circuit at one end of said transmission line stub.

25. The method of claim 19 further comprising the step of also coupling said transmission line stub to a solid dielectric.

26. The method of claim 25 further comprising the step of selecting said solid dielectric to be a circuit board upon which said stub is formed.

27. The method of claim 19 further comprising the step of disposing said transmission line stub on a dielectric circuit board substrate.

28. The method of claim 27 further comprising the step of disposing said fluid dielectric in a cavity within said dielectric circuit board substrate.

29. The method of claim 19 further comprising the step of selecting a component part of said fluid dielectric from the group consisting of a low permittivity, low permeability component, a high permittivity, low permeability component, and a high permittivity, high permeability component.

30. The method according to claim 29 further comprising the step of selectively mixing and communicating a plurality of said components of said fluidic dielectric from respective fluid reservoirs to a cavity where said fluidic dielectric is coupled to said transmission line stub.

31. The method of claim 30 further comprising the step of separating said component parts of said fluidic dielectric for subsequent reuse.

32. The method of claim 19 further comprising the step of selecting at least one component of said fluidic dielectric to be an industrial solvent.

33. The method of claim 19 further comprising the step of selecting at least one component of said fluidic dielectric to be an industrial solvent that has a suspension of magnetic particles contained therein.

34. The method of claim 33 further comprising the step of selecting said magnetic particles from the group consisting of ferrite, metallic salts, and organo-metallic particles.

35. The method of claim 33 further comprising the step of selecting a ratio of said component parts so that said fluid dielectric contains between about 50% to 90% magnetic particles by weight.

* * * * *